United States Patent
Inoto et al.

(10) Patent No.: US 11,121,264 B2
(45) Date of Patent: Sep. 14, 2021

(54) JUNCTION FIELD EFFECT TRANSISTOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hidekazu Inoto, Ota Tokyo (JP); Osamu Takata, Yokohama Kanagawa (JP); Naozumi Terada, Kawasaki Kanagawa (JP); Hiroyoshi Kitahara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/548,739

(22) Filed: Aug. 22, 2019

(65) Prior Publication Data
US 2020/0287057 A1  Sep. 10, 2020

(30) Foreign Application Priority Data

Mar. 8, 2019 (JP) .............................. JP2019-042902

(51) Int. Cl.
*H01L 29/808* (2006.01)
*H01L 29/45* (2006.01)
*H01L 29/06* (2006.01)

(52) U.S. Cl.
CPC ........ *H01L 29/808* (2013.01); *H01L 29/0653* (2013.01); *H01L 29/45* (2013.01)

(58) Field of Classification Search
CPC ... H01L 29/808; H01L 29/45; H01L 29/0653; H01L 29/0603; H01L 29/0692;
(Continued)

(56) References Cited

U.S. PATENT DOCUMENTS 7,528,426 B2  5/2009  Harada et al.
7,557,393 B2  7/2009  Vora
(Continued)

FOREIGN PATENT DOCUMENTS

JP  S55166965 A  12/1980
JP  H05243276 A   9/1993

*Primary Examiner* — Shahed Ahmed
(74) *Attorney, Agent, or Firm* — Kim & Stewart LLP

(57) ABSTRACT

A junction field effect transistor includes a first semiconductor layer of first conductivity type, an element isolation insulator disposed on the first semiconductor layer to partition an active area, a second semiconductor layer of second conductivity type, on the first semiconductor layer in the active area, and having an end in a first direction separated from the element isolation insulator, a source layer of second conductivity type, on the second semiconductor layer, the source layer having an impurity concentration higher than that of the second semiconductor layer, a drain layer of second conductivity type, on the second semiconductor layer, and separated from the source layer in a second direction, the drain layer having an impurity concentration higher than that of the second semiconductor layer, and a gate layer of first conductivity type, on the second semiconductor layer, and between and separated from the source and drain layers.

17 Claims, 4 Drawing Sheets

(58) Field of Classification Search
CPC ............. H01L 29/1058; H01L 29/1066; H01L 29/8086; H01L 29/66893–66924; H01L 2924/13062; H01L 27/098; H01L 27/14679; H01L 29/04–045; H01L 29/16–1608; H01L 29/22–2206; H01L 29/36–365; H01L 29/41; H01L 29/78

See application file for complete search history.

(56) References Cited

U.S. PATENT DOCUMENTS

| | | | |
|---|---|---|---|
| 7,569,873 B2 | 8/2009 | Kapoor | |
| 7,615,809 B2 | 11/2009 | Kobayashi | |
| 8,129,748 B2 | 3/2012 | Uemoto et al. | |
| 2007/0284628 A1* | 12/2007 | Kapoor | H01L 29/66901 257/270 |
| 2011/0284930 A1* | 11/2011 | Hershberger | H01L 29/8086 257/270 |
| 2014/0001518 A1* | 1/2014 | Huang | H01L 29/861 257/270 |
| 2016/0343761 A1* | 11/2016 | Ishino | H01L 27/14636 |
| 2017/0330896 A1* | 11/2017 | See | H01L 29/66901 |

\* cited by examiner

JUNCTION FIELD EFFECT TRANSISTOR

CROSS-REFERENCE TO RELATED APPLICATION

This application is based upon and claims the benefit of priority from Japanese Patent Application No. 2019-042902, filed Mar. 8, 2019, the entire contents of which are incorporated herein by reference.

FIELD

Embodiments described herein relate generally to a junction field effect transistor.

BACKGROUND

In the related art, a junction field effect transistor (JFET) have been developed. JFET is used as an element for converting output voltage of a sensor into a constant current, for example. With an increase in the sensitivity of sensors, it is desirable to reduce noise of JFET.

DETAILED DESCRIPTION

Embodiments provide a junction field effect transistor capable of reducing noise.

In general, according to one embodiment, there is provided a junction field effect transistor includes a first semiconductor layer of a first conductivity type, an element isolation insulator disposed on an upper layer portion of the first semiconductor layer to partition an active area, a second semiconductor layer of a second conductivity type, on the first semiconductor layer in the active area, the second semiconductor layer having an end in a first direction separated from the element isolation insulator, a source layer of the second conductivity type, on the second semiconductor layer, source layer having an impurity concentration higher than an impurity concentration of the second semiconductor layer, a drain layer of the second conductivity type, on the second semiconductor layer, and separated from the source layer in a second direction intersecting the first direction, drain layer having an impurity concentration higher than an impurity concentration of the second semiconductor layer, and a gate layer of the first conductivity type, on the second semiconductor layer, between the source layer and the drain layer, and separated from the source layer and the drain layer.

First Embodiment

The first embodiment will be described below.

Figure 1:
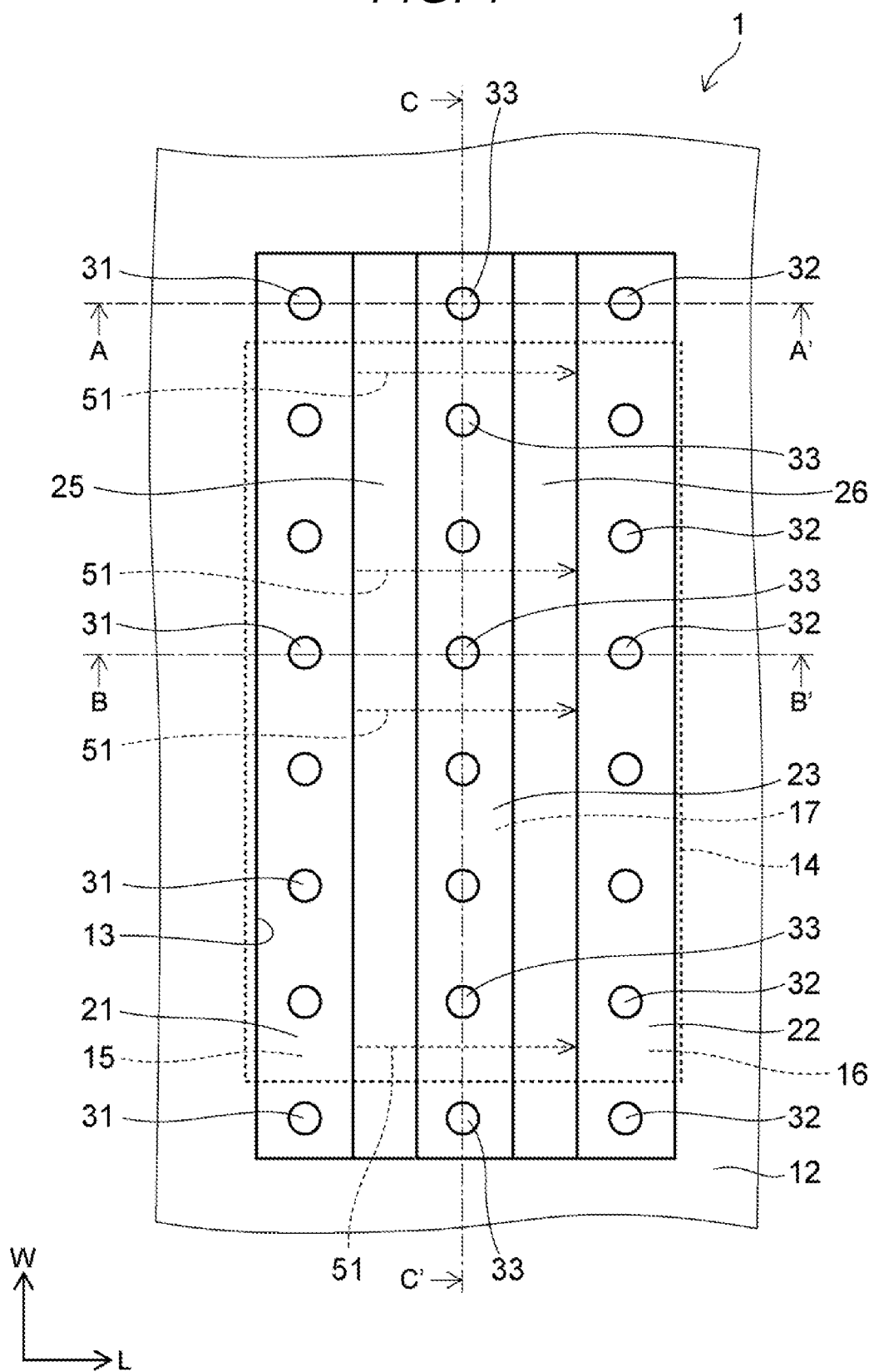
FIG. 1 is a plan view showing a junction field effect transistor according to a first embodiment.

FIG. 1 is a plan view showing a junction field effect transistor according to the present embodiment.

Figure 2A:
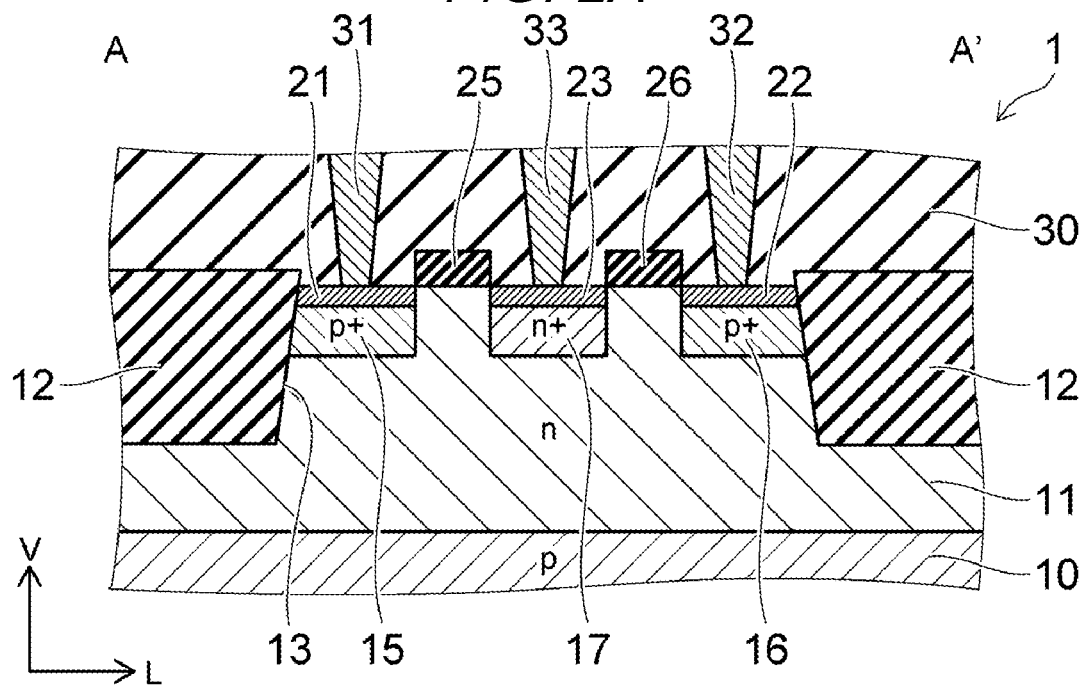
FIG. 2A is a cross-sectional view taken along line A-A' in FIG. 1.
Figure 2B:
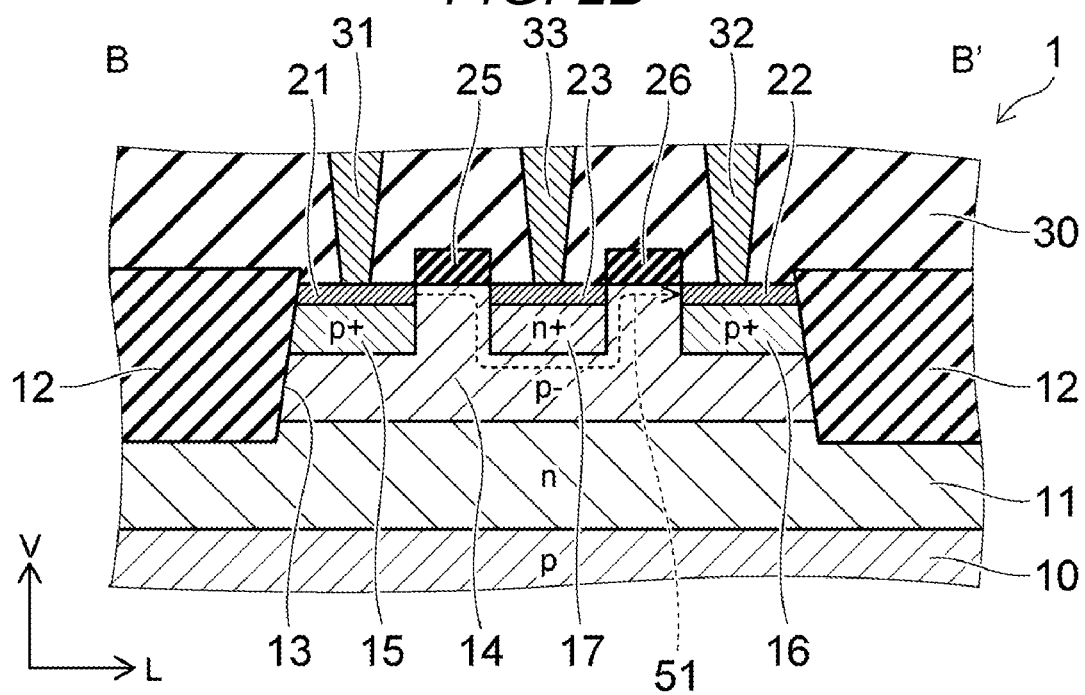
FIG. 2B is a cross-sectional view taken along line B-B' in FIG. 1.

FIG. 2A is a cross-sectional view taken along line A-A' in FIG. 1, and FIG. 2B is a cross-sectional view taken along line B-B' in FIG. 1.

Figure 3:
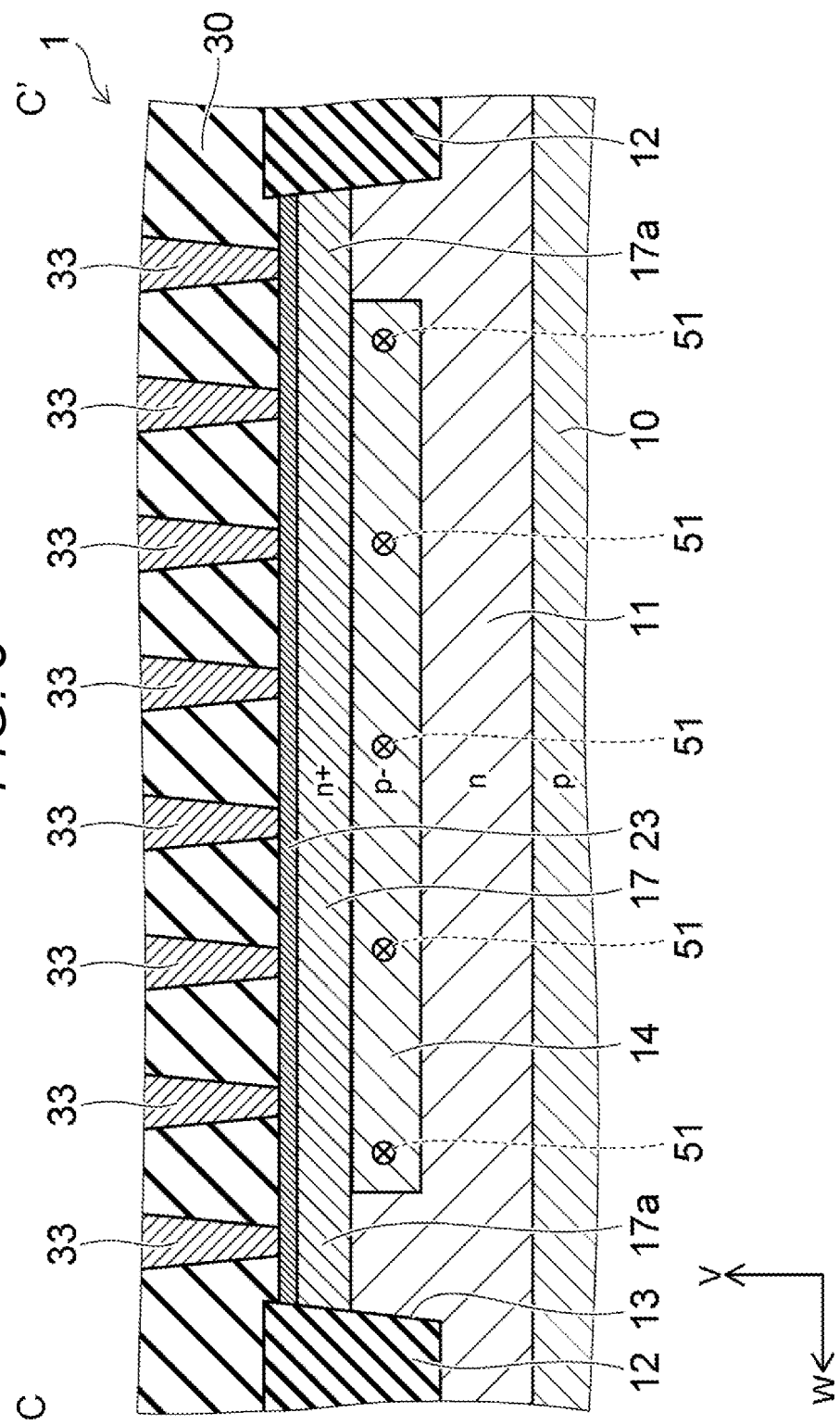
FIG. 3 is a cross-sectional view taken along line C-C' in FIG. 1.

FIG. 3 is a cross-sectional view taken along line C-C' in FIG. 1.

As shown in FIGS. 2A, 2B, and 3, a semiconductor substrate 10 of a p conductivity type is provided in the junction field effect transistor (JFET) 1 according to the present embodiment. The semiconductor substrate 10 is formed of silicon, for example. The same applies to each layer described below.

An n-well 11 of n conductivity type is provided on the semiconductor substrate 10. Hereinafter, in this description, the direction from the semiconductor substrate toward the n-well 11 is referred to as an "upper direction", and the opposite direction is referred to as a "lower direction". The terms "upper" and "lower" are also collectively referred to as a "vertical direction V". "Viewing from above" means observation by a line of sight in the direction from the n-well 11 to the semiconductor substrate 10. A shallow trench isolation (STI) 12 is provided in the upper layer portion of the n-well 11. The STI 12 is made of an insulating material such as silicon oxide, for example. The STI 12 surrounds a part of the upper layer portion of the n-well 11. A portion of the upper layer portion of the n-well 11, that is surrounded by the STI 12 is referred to as an active area 13. The active area 13 is partitioned from periphery by the STI 12. When viewed from above, the shape of the active area 13 is rectangular.

A channel layer 14 of p conductivity type is provided on the n-well 11 in the active area 13. The lower surface of the channel layer 14 is located above the lower surface of the STI 12. Both ends of the channel layer 14 in a gate length direction L are in contact with the STI 12. Both ends of the channel layer 14 in a gate width direction W are separated from the STI 12. A part of the n-well 11 is interposed between both ends in the gate width direction W of the channel layer 14 and the STI 12.

A source layer 15 of a p+ conductivity type is provided on the channel layer 14. The source layer 15 is disposed at one end of the active area 13 in the gate length direction L, and is in contact with the STI 12, for example. Further, the source layer 15 extends in the gate width direction W. For example, when viewed from above, both ends in the gate width direction W of the source layer 15 protrude from the channel layer 14 and are located outside the channel layer 14. Therefore, the lower surfaces of both ends of the source layer 15 are in contact with the n-well 11. Further, both ends of the source layer 15 in the gate width direction W are in contact with the STI 12.

A drain layer 16 of p+ conductivity type is provided on the channel layer 14. The drain layer 16 is disposed at the other end of the active area 13 in the gate length direction L, contacts the STI 12, and is separated from the source layer 15, for example. In addition, the drain layer 16 extends in the gate width direction W. For example, when viewed from above, both ends in the gate width direction W of the drain layer 16 protrude from the channel layer 14 and are located outside the channel layer 14. Therefore, the lower surfaces of both ends of the drain layer 16 are in contact with the n-well 11. Further, both ends of the drain layer 16 in the gate width direction W are in contact with the STI 12.

An impurity concentration of the source layer 15 and an impurity concentration of the drain layer 16 are higher than an impurity concentration of the channel layer 14. In the present specification, "impurity concentration" refers to a concentration of an impurity that contributes to the conductivity of a semiconductor, and when both an impurity serving as a donor and an impurity serving as an acceptor are included, refers to a concentration of effective impurity excluding an amount corresponding to the offsetting amounts.

A gate layer 17 of n+ conductivity type is provided on the channel layer 14. An impurity concentration of the gate layer 17 is higher than an impurity concentration of the n-well 11. The gate layer 17 extends in the gate width direction W, is disposed between the source layer 15 and the drain layer 16, and is separated from the source layer 15 and the drain layer 16. When viewed from above, ends 17a on both sides of the gate layer 17 in the gate width direction W protrude from the channel layer 14 and are located outside the channel layer 14. Therefore, the lower surface of the ends 17a of the gate layer 17 is in contact with the n-well 11. The ends 17a are also in contact with the STI 12.

A salicide layer 21 is provided on the entire upper surface of the source layer 15, for example. A salicide layer 22 is provided on the entire upper surface of the drain layer 16, for example. A salicide layer 23 is provided on the entire upper surface of the gate layer 17, for example. A salicide block 25 is provided on a portion of the active area 13, located between the source layer 15 and the gate layer 17. A salicide block 26 is provided on a portion of the active area 13, located between the drain layer 16 and the gate layer 17. The salicide blocks 25 and 26 are insulating films and made of silicon oxide, for example.

An interlayer insulating film 30 is provided on the STI 12, the salicide layers 21 to 23, and the salicide blocks 25 and 26. The interlayer insulating film 30 is made of an insulating material such as silicon oxide, for example. A source contact 31, a drain contact 32, and a gate contact 33 are provided in the interlayer insulating film 30.

A source contact 31 is in contact with the salicide layer 21 and connected to the source layer 15 through the salicide layer 21. The drain contact 32 is in contact with the salicide layer 22 and is connected to the drain layer 16 through the salicide layer 22. The gate contact 33 is in contact with the salicide layer 23 and is connected to the gate layer 17 through the salicide layer 23. Both ends 17a of the gate layer 17 in the gate width direction W are connected to the n-well 11. Thus, a p-channel type junction field effect transistor (JFET) 1 is formed. It should be noted that the interlayer insulating film 30 is omitted in FIG. 1 in order to make the drawing easier to see.

Next, an operation of JFET 1 according to the present embodiment will be described.

In JFET 1, a source potential is applied to the source layer 15 through a source contact 31 and the salicide layer 21. In addition, a drain potential is applied to the drain layer 16 through the drain contact 32 and the salicide layer 22. Furthermore, a gate potential is applied to the gate layer 17 through the gate contact 33 and the salicide layer 23. The gate potential is also applied to the n-well 11 through the ends 17a of the gate layer 17.

When the gate potential is the same as the source potential, no depletion layer is formed in the channel layer 14. Therefore, a source and drain current 51 flows from the source layer 15 toward the drain layer 16. In FIGS. 1 and 2B, a part of the source and drain current 51 is indicated by a broken arrow. On the other hand, when the gate potential is higher than the source potential, a depletion layer is formed in the channel layer 14 and the source and drain current 51 is decreased. When the depletion layer reaches the lower surface of the channel layer 14, the source and drain current 51 is cut off. Thus, the magnitude of the source and drain current 51 can be controlled by controlling the gate potential.

Next, effects of the present embodiment will be described.

In JFET 1, both ends of the channel layer 14 in the gate width direction W are separated from the STI 12, so that no source and drain current 51 flows in the vicinity of the STI 12. As a result, noise of the source and drain current 51 can be reduced.

Further, in JFET 1, both ends of the channel layer 14 in the gate width direction W are separated from the STI 12, and ends 17a of the gate layer 17 are in contact with the n-well 11, so that the gate potential can be applied from the gate contact 33 to the n-well 11 through the gate layer 17. As a result, there is no need to provide a structure for applying the gate potential to the n-well 11 outside the active area 13, and JFET 1 can be miniaturized.

On the other hand, when both ends of the channel layer 14 in the gate width direction W are in contact with the STI 12, the source and drain current 51 also flows in the vicinity of the STI 12. Since many irregularities of the side surface of the STI 12, crystal defects of the channel layer 14 due to the presence of the STI 12, fixed charges, and the like are present in the vicinity of the interface between the STI 12 and the channel layer 14, flicker noise is generated in the source and drain current 51 by flowing in this region.

Further, when the channel layer 14 is provided over the entire length of the active area 13 in the gate width direction W, it is necessary to provide a configuration for applying a potential to the n-well 11 outside the active area 13. For example, it is necessary to provide a region in which the STI 12 and the channel layer 14 are not provided outside the frame-shaped STI 12 which partitions the active area 13 and connect a dedicated contact to this region. This causes JFET to be larger.

Second Embodiment

Next, a second embodiment will be described.

Figure 4:
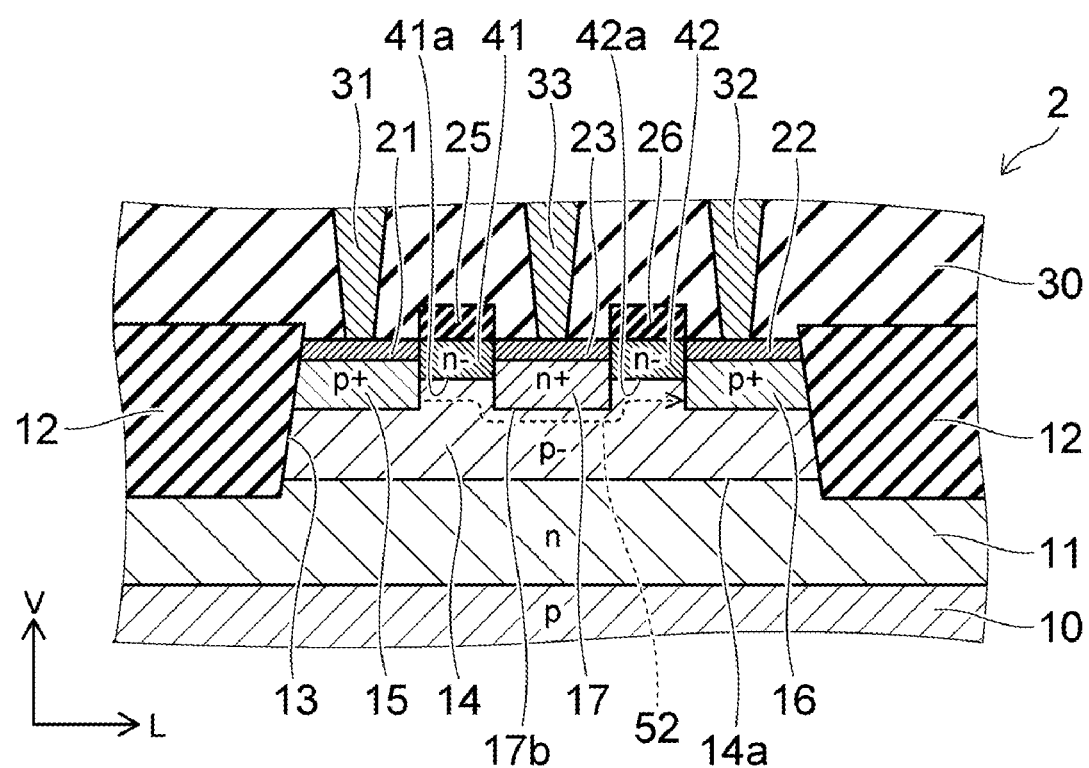
FIG. 4 is a cross-sectional view showing a junction field effect transistor according to a first embodiment.

FIG. 4 is a cross-sectional view showing a junction field effect transistor according to the present embodiment.

The cross section shown in FIG. 4 corresponds to the cross section shown in FIG. 2B in the first embodiment.

As shown in FIG. 4, in addition to the configuration of JFET 1 according to the first embodiment described above, in a junction field effect transistor (JFET) 2 according to the present embodiment, an n-type layer 41 and n-type layer 42, both of n conductivity type, are provided. An impurity concentration of the n-type layer 41 and the n-type layer is lower than the impurity concentration of the gate layer 17.

The n-type layer 41 is disposed, in the gate length direction L, between the source layer 15 and the gate layer 17 and between the salicide layer 21 and the salicide layer 23 and in the vertical direction V, is disposed between the channel layer 14 and the salicide block 25. In the n-type layer 41, the upper surface is in contact with the lower surface of the salicide block 25, the lower surface is in contact with the upper surface of the channel layer 14, the side surface on the source layer 15 side is in contact with the source layer 15 and the salicide layer 21, and the side surface on the gate layer 17 side is in contact with the gate layer 17 and the salicide layer 23. In addition, the side surfaces on both sides of the n-type layer 41 in the gate width direction W are preferably in contact with the STI 12. A lower surface 41a of the n-type layer 41 is located above a lower surface 17b of the gate layer 17, for example. The lower surface 41a of the n-type layer 41 may be located below the lower surface 17b of the gate layer 17, but it needs to be located above a lower surface 14a of the channel layer 14.

The n-type layer 42 is, in the gate length direction L, disposed between the drain layer 16 and the gate layer 17 and between the salicide layer 22 and the salicide layer 23, and in the vertical direction V, is disposed between the channel layer 14 and the salicide block 26. In the n-type layer 42, the upper surface is in contact with the lower surface of the salicide block 26, the lower surface is in contact with the upper surface of the channel layer 14, the side surface on the drain layer 16 side is in contact with the drain layer 16 and the salicide layer 22, and the side surface on the gate layer 17 side is in contact with the gate layer 17 and the salicide layer 23. In addition, the side surfaces on both sides of the n-type layer 42 in the gate width direction W are preferably in contact with the STI 12. A lower surface 42a of the n-type layer 42 is located above the lower surface 17b of the gate layer 17, for example. The lower surface 42a of the n-type layer 42 may be located below the lower surface 17b of the gate layer 17, but it needs to be located above the lower surface 14a of the channel layer 14.

Next, effects of the present embodiment will be described.

As shown in FIG. 4, in JFET 2 according to the present embodiment, a source and drain current 52 flows through the n-type layer 41 and the n-type layer 42. Therefore, the source and drain current 52 does not flow in the vicinity of the salicide blocks 25 and 26. As a result, it is possible to prevent the generation of flicker noise in the source and drain current 52 due to the irregularities on the lower surface of the salicide blocks 25 and 26, crystal defects in the vicinity of the salicide blocks 25 and 26 in the channel layer 14, fixed charges, and the like. As a result, according to the present embodiment, the noise of the source and drain current 52 can be further reduced.

Configurations, operations, and effects other than those described above in the present embodiment are the same as those in the first embodiment described above.

In the first and second embodiments described above, an example is shown in which both ends of the channel layer 14 in the gate width direction W are separated from the STI 12. Alternatively, only one end of the channel layer 14 in the gate width direction W may be separated from the STI 12 and the other end thereof may be in contact with the STI 12.

In the first and second embodiments described above, the p-channel type junction field effect transistor is described as an example. Alternatively, the junction field effect transistor may be an n-channel type. In this case, a p-well is provided instead of the n-well 11 described above, but an n-type deep well electrically separating the p-well from a silicon substrate 10 may be provided between this p-well and the silicon substrate 10.

According to the embodiment described above, the junction field effect transistor capable of reducing noise can be achieved.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A junction field effect transistor, comprising:
a first semiconductor layer of a first conductivity type;
an element isolation insulator disposed on an upper layer portion of the first semiconductor layer to partition an active area;
a second semiconductor layer of a second conductivity type, on the first semiconductor layer in the active area, the second semiconductor layer having an end in a first direction separated from the element isolation insulator;
a source layer of the second conductivity type, on the second semiconductor layer, the source layer having an impurity concentration higher than an impurity concentration of the second semiconductor layer;
a drain layer of the second conductivity type, on the second semiconductor layer, and separated from the source layer in a second direction intersecting the first direction, the drain layer having an impurity concentration higher than the impurity concentration of the second semiconductor layer; and
a gate layer of the first conductivity type, on the second semiconductor layer, between the source layer and the drain layer, and separated from the source layer and the drain layer,
wherein ends of the second semiconductor layer in the second direction are in contact with the element isolation insulator.

2. The junction field effect transistor according to claim 1, wherein an end of the gate layer in the first direction is in contact with the first semiconductor layer.

3. The junction field effect transistor according to claim 1, wherein both ends of the gate layer in the first direction are in contact with the first semiconductor layer.

4. The junction field effect transistor according to claim 3, wherein both ends of the second semiconductor layer in the first direction are separated from the element isolation insulator.

5. The junction field effect transistor according to claim 1, wherein the source layer, the drain layer, and the gate layer extend in the first direction.

6. The junction field effect transistor according to claim 1, further comprising:
a salicide layer on an upper surface of each of the source layer, the drain layer, and the gate layer.

7. The junction field effect transistor according to claim 1, further comprising:
a first salicide block on the second semiconductor layer between the source layer and the gate layer; and
a second salicide block on the second semiconductor layer between the gate layer and the drain layer.

8. The junction field effect transistor according to claim 1, further comprising:
a third semiconductor layer of the first conductivity type, on the second semiconductor layer and between the source layer and the gate layer, the third semiconductor layer having an impurity concentration lower than an impurity concentration of the gate layer; and
a fourth semiconductor layer of the first conductivity type, on the second semiconductor layer and between the drain layer and the gate layer, the fourth semiconductor layer having an impurity concentration lower than an impurity concentration of the gate layer.

9. The junction field effect transistor according to claim 8, wherein a lower surface of the third semiconductor layer is located above a lower surface of the gate layer, and a lower surface of the fourth semiconductor layer is located above a lower surface of the gate layer.

10. The junction field effect transistor according to claim 8,
wherein a lower surface of the third semiconductor layer is located below an upper surface of the source layer, and a lower surface of the fourth semiconductor layer is located below an upper surface of the drain layer.

11. The junction field effect transistor according to claim 8,
wherein the third semiconductor layer is in contact with the source layer and the gate layer and the fourth semiconductor layer is in contact with the gate layer and the drain layer.

12. A junction field effect transistor, comprising:
a first semiconductor layer of a first conductivity type;
an element isolation insulator disposed on an upper layer portion of the first semiconductor layer to partition an active area;
a second semiconductor layer of a second conductivity type, on the first semiconductor layer in the active area, the second semiconductor layer having an end in a first direction separated from the element isolation insulator;
a source layer of the second conductivity type, on the second semiconductor layer, the source layer having an impurity concentration higher than an impurity concentration of the second semiconductor layer;
a drain layer of the second conductivity type, on the second semiconductor layer, and separated from the source layer in a second direction intersecting the first direction, the drain layer having an impurity concentration higher than the impurity concentration of the second semiconductor layer;
a gate layer of the first conductivity type, on the second semiconductor layer, between the source layer and the drain layer, and separated from the source layer and the drain layer;
a salicide layer on an upper surface of each of the source layer, the drain layer, and the gate layer;
a source contact on an upper surface of the salicide layer on the upper surface of the source layer;
a gate contact on an upper surface of the salicide layer on the upper surface of the gate layer;
a drain contact on an upper surface of the salicide layer on the upper surface of the drain layer;
a third semiconductor layer of the first conductivity type, on the second semiconductor layer and between the source layer and the gate layer, the third semiconductor layer having an impurity concentration lower than an impurity concentration of the gate layer; and
a fourth semiconductor layer of the first conductivity type, on the second semiconductor layer and between the drain layer and the gate layer, the fourth semiconductor layer having an impurity concentration lower than an impurity concentration of the gate layer,
wherein, when the junction field effect transistor is turned ON, a source-to-drain current flows from the source layer to the second semiconductor layer that is below the gate layer and then to the drain layer, and
wherein the source-to-drain current does not flow from the salicide layer on the upper surface of the source layer directly to the second semiconductor layer and does not flow from the second semiconductor layer directly to the salicide layer on the upper surface of the drain layer.

13. The junction field effect transistor according to claim 12,
wherein a lower surface of the third semiconductor layer is located above a lower surface of the gate layer, and a lower surface of the fourth semiconductor layer is located above a lower surface of the gate layer.

14. The junction field effect transistor according to claim 12,
wherein a lower surface of the third semiconductor layer is located below an upper surface of the source layer, and a lower surface of the fourth semiconductor layer is located below an upper surface of the drain layer.

15. The junction field effect transistor according to claim 12,
wherein the third semiconductor layer is in contact with the source layer and the gate layer and the fourth semiconductor layer is in contact with the gate layer and the drain layer.

16. A junction field effect transistor, comprising:
a first semiconductor layer of a first conductivity type;
an element isolation insulator disposed on an upper layer portion of the first semiconductor layer to partition an active area that extends in a first direction;
a second semiconductor layer of a second conductivity type, on the first semiconductor layer in the active area, the second semiconductor layer also extending in the first direction, both ends of the active area in the first direction extending further in the first direction than both ends of the second semiconductor layer in the first direction;
a source layer of the second conductivity type, on the second semiconductor layer, the source layer having an impurity concentration higher than an impurity concentration of the second semiconductor layer;
a drain layer of the second conductivity type, on the second semiconductor layer, and separated from the source layer in a second direction intersecting the first direction, the drain layer having an impurity concentration higher than the impurity concentration of the second semiconductor layer; and
a gate layer of the first conductivity type, on the second semiconductor layer, between the source layer and the drain layer, and separated from the source layer and the drain layer,
wherein ends of the second semiconductor layer in the second direction are in contact with the element isolation insulator.

17. The junction field effect transistor according to claim 16,
wherein a lower surface of the gate layer at both ends of the gate layer in the first direction are in contact with portions of the active area that are between the second semiconductor layer and the element isolation insulator.

* * * * *